US006461878B1

(12) United States Patent
Lansford

(10) Patent No.: US 6,461,878 B1
(45) Date of Patent: Oct. 8, 2002

(54) FEEDBACK CONTROL OF STRIP TIME TO REDUCE POST STRIP CRITICAL DIMENSION VARIATION IN A TRANSISTOR GATE ELECTRODE

(75) Inventor: Jeremy S. Lansford, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/614,666

(22) Filed: Jul. 12, 2000

(51) Int. Cl.$^7$ .......................... G01R 31/26; H01L 21/66
(52) U.S. Cl. ........................................................ 438/14
(58) Field of Search ........................... 438/4, 5, 14, 17; 156/626.1

(56) References Cited

U.S. PATENT DOCUMENTS

| | | | | | |
|---|---|---|---|---|---|
| 5,503,707 | A | * | 4/1996 | Maung et al. ............ | 156/626.1 |
| 5,591,299 | A | * | 1/1997 | Seaton et al. ............ | 156/626.1 |
| 5,622,636 | A | * | 4/1997 | Huh et al. ................. | 438/5 |
| 5,637,185 | A | * | 6/1997 | Murarka et al. ......... | 438/5 |
| 5,639,342 | A | | 6/1997 | Chen et al. .............. | 156/626.1 |
| 5,655,110 | A | | 8/1997 | Krivokapic et al. ..... | 395/500 |
| 5,851,846 | A | * | 12/1998 | Matsui et al. ........... | 438/17 |
| 5,913,102 | A | | 6/1999 | Yang ........................ | 438/14 |
| 5,926,690 | A | | 7/1999 | Toprac et al. ........... | 438/17 |
| 6,096,233 | A | * | 8/2000 | Taniyama et al. ....... | 216/92 |
| 6,194,230 | B1 | * | 2/2001 | Li et al. ................... | 438/5 |
| 6,197,604 | B1 | * | 3/2001 | Miller et al. ............. | 438/14 |
| 6,228,769 | B1 | * | 5/2001 | Li et al. ................... | 438/692 |
| 6,319,420 | B1 | * | 11/2001 | Dow ........................ | 216/86 |
| 2001/0000753 | A1 | * | 5/2001 | Yoshida et al. ......... | 438/5 |

FOREIGN PATENT DOCUMENTS

| | | | | |
|---|---|---|---|---|
| WO | 00/79355 | 12/2000 | ......... | G05B/19/418 |
| WO | 01/22183 | 3/2001 | ......... | G05B/19/418 |

OTHER PUBLICATIONS

"Supervisory Run–to–Run Control of Polysilicon Gate Etch Using *In Situ* Ellipsometry" by Stephanie Watts Butler and Jerry A. Stefani, Published in IEEE Transactions on Semiconductor Manufacturing, vol. 7, No. 2 May 1994.
International Search Report dated Feb. 13, 2002 for International application No. PCT/US01/21338 Filed Jul. 3, 2001.

* cited by examiner

Primary Examiner—Olik Chaudhuri
Assistant Examiner—David S Blum
(74) Attorney, Agent, or Firm—Williams, Morgan & Amerson, P.C.

(57) ABSTRACT

A method for decreasing variations in gate electrode widths is provided. The method includes providing a wafer having a gate electrode formed thereon and an anti-reflective coating layer formed over at least a portion of the gate electrode. The gate electrode has a width. The width of the gate electrode is measured. A strip rate for a strip tool adapted to remove the anti-reflective coating is determined. The measured width of the gate electrode is compared to a target gate electrode critical dimension to determine an overetch time based on the strip rate. The operating recipe of the strip tool is modified based on the overetch time. A processing line includes a first metrology tool, a strip tool, and a process controller. The first metrology tool is adapted to measure the width of a gate electrode formed on a wafer. The gate electrode has an anti-reflective coating layer formed over at least a portion of the gate electrode. The strip tool is adapted to remove the anti-reflective coating. The process controller is adapted to determine a strip rate for the strip tool, compare the width of the gate electrode to a target gate electrode critical dimension to determine an overetch time based on the strip rate, and modify the operating recipe of the strip tool layer based on the overetch time.

18 Claims, 4 Drawing Sheets

FEEDBACK CONTROL OF STRIP TIME TO REDUCE POST STRIP CRITICAL DIMENSION VARIATION IN A TRANSISTOR GATE ELECTRODE

BACKGROUND OF THE INVENTION

1. Field of the Invention

This invention relates generally to the field of semiconductor device manufacturing and, more particularly, to a method and apparatus for using feedback control of strip time to reduce post strip critical dimension variation in a transistor gate electrode.

2. Description of the Related Art

A continuing trend in semiconductor technology is to build integrated circuits with more and/or faster semiconductor devices. The drive toward this ultra large-scale integration (ULSI) has resulted in continued shrinking of device and circuit dimensions and features. In integrated circuits having field-effect transistors, for example, one very important process step is the formation of the gate electrode for each of the transistors, with particular emphasis being placed on the dimensions of the gate electrode. In many applications, the performance characteristics (e.g., switching speed) and size of the transistor are functions of the channel length of the device, which corresponds approximately to the width of the transistor's gate electrode. Thus, for example, a narrower device with a smaller channel length tends to produce a higher performance transistor (e.g., faster) that is inherently smaller in size.

Typically, a gate electrode is formed by patterning a process layer comprised of the gate electrode material (e.g., polysilicon) using traditional photolithographic techniques. In accordance with conventional practices, an anti-reflective coating (ARC) is sometimes used to minimize notches caused by reflections during photolithographic techniques. Typically, an ARC layer is formed over a polysilicon layer. A photoresist layer is formed over the ARC layer. The ARC layer reduces the reflections and allows more effective patterning of the photoresist layer, which ultimately results in more effective formation of the gate electrodes from the polysilicon layer. Exemplary ARC layer materials are silicon oxynitride and silicon rich nitride.

Subsequent to the formation of the gate electrode, the ARC layer is removed using an etch process such as a hot hydrofluoric acid (HF) strip followed by a hot phosphoric acid ($H_3PO_4$) strip. The first hydrofluoric acid strip is relatively short and functions to remove a thin layer of silicon dioxide that grows on the surface of the ARC layer due to exposure to atmospheric oxygen. Such a silicon dioxide also forms on the exposed surface of the polysilicon gate electrode, but its removal is not the impetus for the hydrofluoric acid strip. The phosphoric acid strip, which is not particularly suited for removing silicon dioxide, removes the ARC layer covering the top surface of the gate electrode.

The phosphoric acid strip also slowly etches the polysilicon gate electrode, thus reducing its critical dimension. The strip rate of the phosphoric acid bath used to remove the ARC layer changes over its service life. Accordingly, the strip time used in the operating recipe of the strip tool includes a certain amount of overetch time to ensure that all of the ARC layer is removed even when the bath is at its most degraded level. The strip rate of the bath degrades based on the number of wafers etched due to the buildup of reaction products. The bath also degrades over time due to changes in the relative concentration of phosphoric acid oxidation states in the bath. Hence, wafers processed nearer the beginning of the bath service life will be stripped at a higher rate, resulting in a greater reduction in the critical dimension of the gate electrode. The variations in the strip rate of the bath translate to outgoing variations in the critical dimension of the gate electrode. Variations in the critical dimension of the gate electrode translate to variations in device speed, leakage, and other transistor performance parameters. Generally, increased variation reduces throughput, yield, and profitability.

The present invention is directed to overcoming, or at least reducing the effects of, one or more of the problems set forth above.

SUMMARY OF THE INVENTION

One aspect of the present invention is seen in a method for decreasing variations in gate electrode widths is provided. The method includes providing a wafer having a gate electrode formed thereon and an anti-reflective coating layer formed over at least a portion of the gate electrode. The gate electrode has a width. The width of the gate electrode is measured. A strip rate for a strip tool adapted to remove the anti-reflective coating is determined. The measured width of the gate electrode is compared to a target gate electrode critical dimension to determine an overetch time based on the strip rate. The operating recipe of the strip tool is modified based on the overetch time.

Another aspect of the present invention is seen in a processing line including a first metrology tool, a strip tool, and a process controller. The first metrology tool is adapted to measure the width of a gate electrode formed on a wafer. The gate electrode has an anti-reflective coating layer formed over at least a portion of the gate electrode. The strip tool is adapted to remove the anti-reflective coating. The process controller is adapted to determine a strip rate for the strip tool, compare the width of the gate electrode to a target gate electrode critical dimension to determine an overetch time based on the strip rate, and modify the operating recipe of the strip tool layer based on the overetch time.

BRIEF DESCRIPTION OF THE DRAWINGS

The invention may be understood by reference to the following description taken in conjunction with the accompanying drawings, in which like reference numerals identify like elements, and in which.

Figure 1:
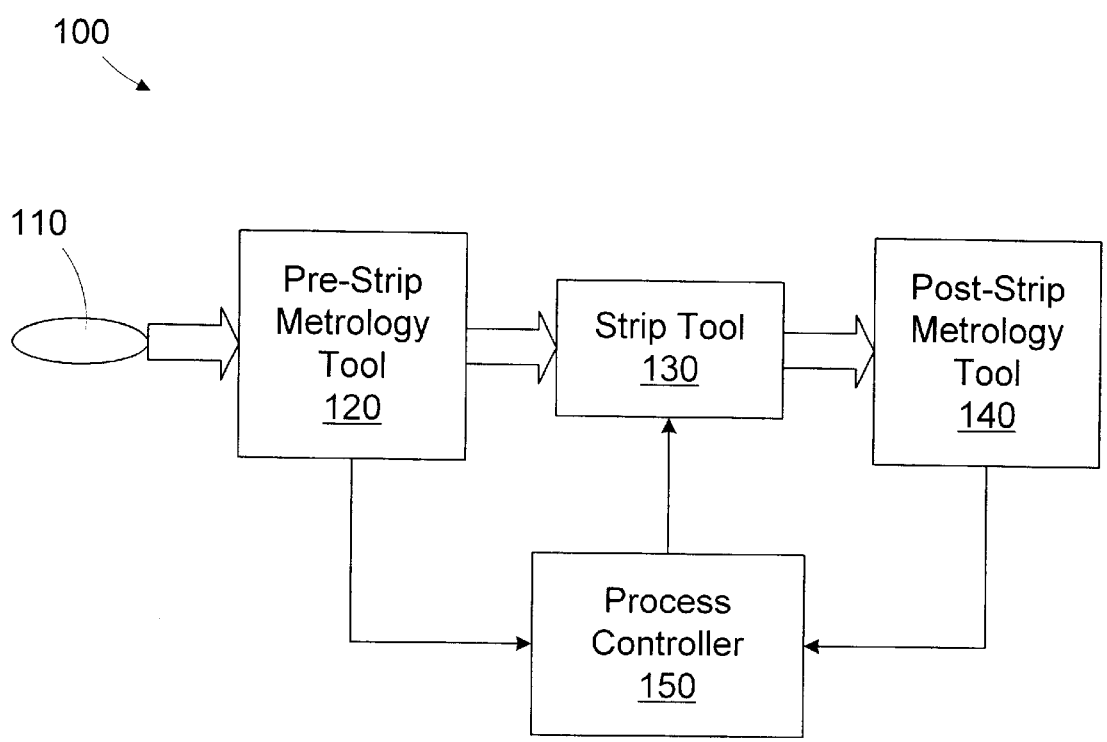
FIG. 1 is a simplified block diagram of a processing line in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to FIG. 1, a simplified diagram of a portion of an illustrative processing line 100 for processing wafers 110 in accordance with the present invention is provided. The processing line 100 includes a pre-strip metrology tool 120, a strip tool 130, a post-strip metrology tool 140, and a process controller 150. The strip tool 130 is adapted to remove an ARC layer, such as silicon oxynitride, present on a transistor gate electrode after patterning. The strip tool 130 is illustrated as a single tool, but in an actual implementation, the strip tool 130 may be a plurality of stripping tools adapted to perform a plurality of stripping operations, such as a hydrofluoric acid strip and a phosphoric acid strip.

The process controller 150 receives data from the metrology tools 120, 140 and adjusts the operating recipe of the strip tool 130 to reduce variations in the critical dimensions of the outgoing transistor gate electrodes. In the illustrated embodiment, the metrology tools 120, 140 are scanning electron microscopes. Although, distinct metrology tools 120, 140 are illustrated, a single tool may be used for the pre-strip and post-strip measurements. Also, each metrology tool 120, 140 may comprise more than one metrology tool. For example, the pre-strip metrology tool 120 may measure the width of the gate electrode (e.g., using a scanning electron microscope) and also the thickness of the ARC layer (e.g., using an Optiprobe thickness measurement tool).

In the illustrated embodiment, the process controller 150 is a computer programmed with software to implement the functions described. However, as will be appreciated by those of ordinary skill in the art, a hardware controller designed to implement the particular functions may also be used. Moreover, the functions performed by the process controller 150, as described herein, may be performed by multiple controller devices distributed throughout a system. Additionally, the process controller 150 may be a stand-alone controller, it may be resident on the strip tool 130, or it may be part of a system controlling operations in an integrated circuit manufacturing facility. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the process controller 140 as described is the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 2A:
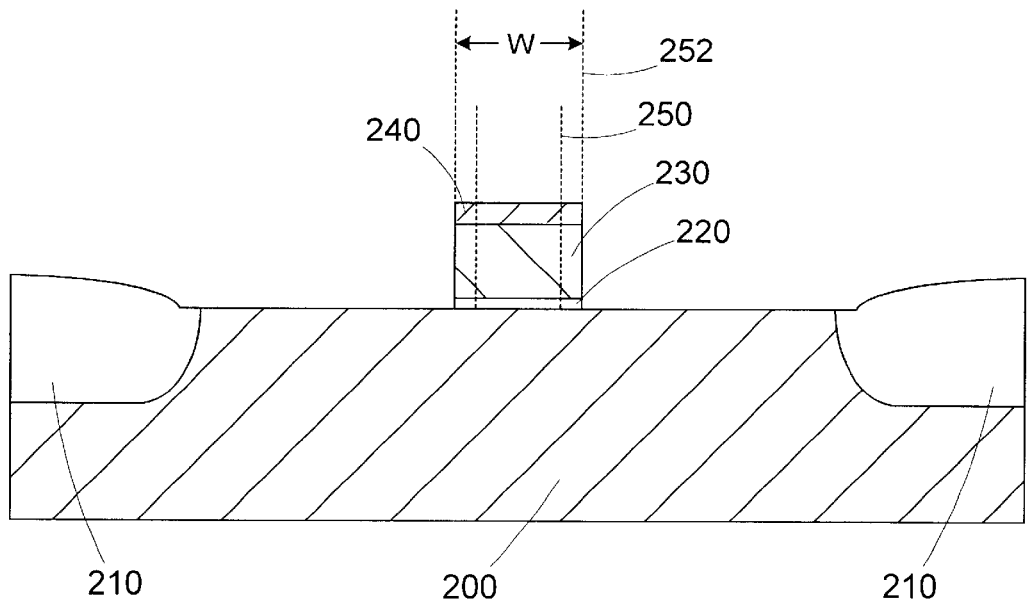
FIGS. 2A–2B show schematic cross-sectional views of various procedural steps in the formation of a transistor to illustrate the operation of the process controller of FIG. 1.
Figure 2B:
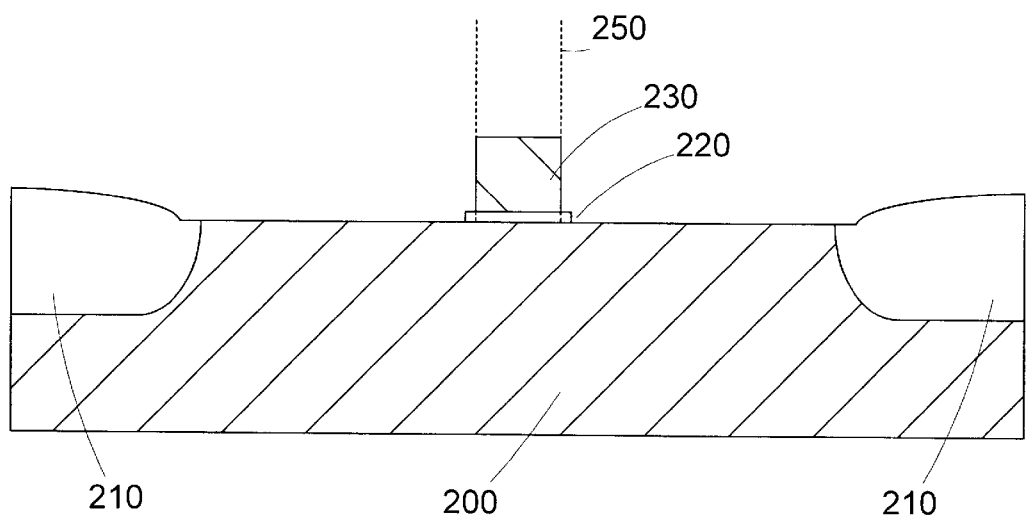

FIGS. 2A–2B and 3A–3B show schematic cross-sectional views of various procedural steps in the formation of a transistor. In FIG. 2A, a substrate 200 having shallow trench isolation (STI) structures 210 formed thereon is shown. A gate insulation layer 220 is formed on the substrate 200. A gate electrode 230 is formed over the gate insulation layer 220. The gate insulation layer 220 isolates the gate electrode 230 from the substrate 200. During the patterning of the gate electrode 230, an anti-reflective coating (ARC) layer 240 is applied to minimize notches caused by reflections during photolithographic techniques. A target critical dimension 250 for the gate electrode is denoted by dashed lines. Note that the target critical dimension 250 is less than the actual width (W) of the gate electrode 230, as indicated by dashed lines 252 The pre-strip metrology tool 120 of FIG. 1 measures the width of the gate electrode 230 and provides the measurement to the process controller 150. As seen in FIG. 2B, the process controller 150 adapts the recipe of the strip tool 130 to remove the ARC layer 240 and to continue etching the gate electrode 230 until its width matches the target critical dimension 250. The functions of the process controller for adjusting the recipe of the strip tool 130 are described in greater detail below.

Figure 3A:
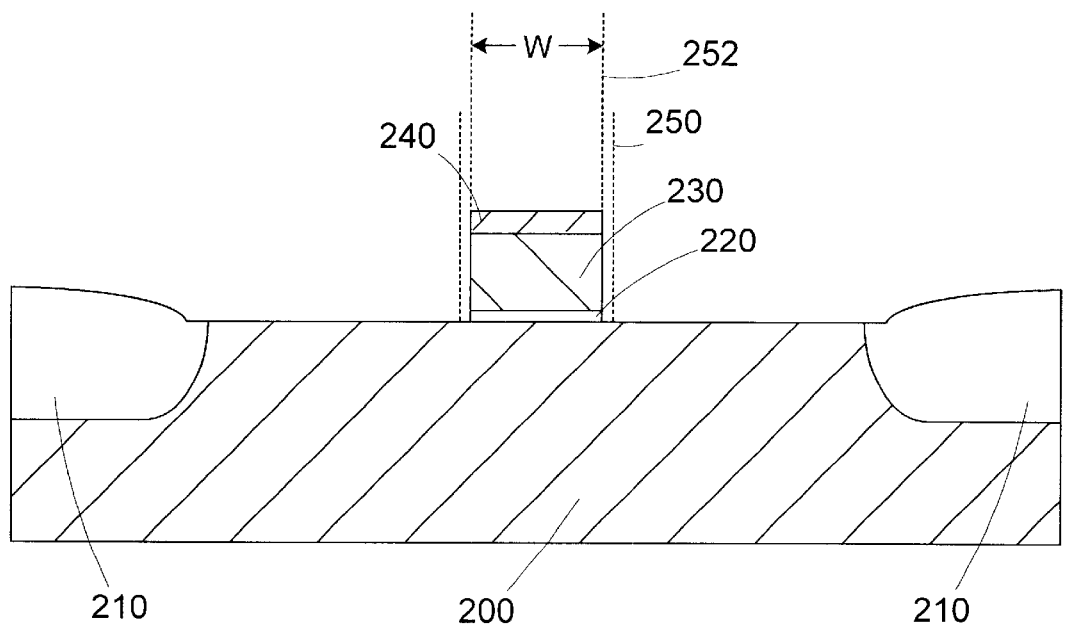
FIGS. 3A–3B show schematic cross-sectional views of various procedural steps in the formation of a transistor to illustrate the operation of the process controller of FIG. 1.
Figure 3B:
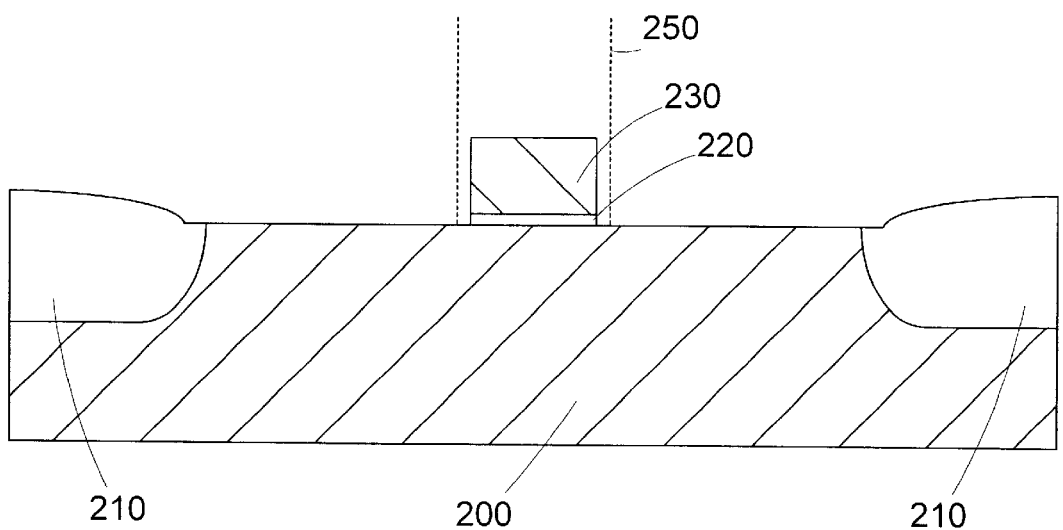

In the example illustrated in FIG. 3A, the target critical dimension 250 is greater than the actual width (W) of the gate electrode 230, as denoted by dashed lines 252. Based on the measurement of the pre-strip metrology tool 120, the process controller 150 adapts the recipe of the strip tool 130 to remove the ARC layer 240, but to stop etching as soon as a minimum strip time is reached to minimize the amount of overetching of the gate electrode 230 (see FIG. 3B). The width of the gate electrode 230 may still be slightly reduced, but the overetch time is minimized to prevent too great of a width reduction of the gate electrode 230.

In summary, the process controller 150 determines a minimum strip time for removing the ARC layer 240 and an overetch time for reducing the width of the gate electrode 230 to reach the target critical dimension 250. If the width of the gate electrode 230 is already narrower than the target critical dimension 250 prior to the strip, the overetch time is set to zero. The process controller 150 selects the greater of the minimum strip time and the overetch time for adapting the recipe of the strip tool 130.

The process controller 150 may use one or more models for determining the minimum strip time and the overetch time. These models may include relatively simple equation based models (e.g., linear, exponential, weighted average, etc.) or more complex models, such as a neural network model, principal component analysis (PCA) model, or a projection to latent structures (PLS) model. The specific implementation of the model may vary depending on the modeling technique selected, and such specific implementation is well known to those of ordinary skill in the art. Thus, for clarity and ease of illustration, such specific details are not described in greater detail herein.

The process controller 150 may operate in a feedback control mode or a feedforward control mode. In a feedback mode, the process controller receives the pre-strip and post-strip width measurements for the gate electrode 230 to determine a strip rate. For subsequently processed wafers 110, the strip rate is used in conjunction with the incoming data as to the width of gate electrode 230 and a target gate electrode critical dimension to determine the overetch time for the subsequent wafer 110. An exponential weighted average may be used to account for the general decreasing strip rate trend evident in the strip tool 130 due to bath degradation. The process controller 150 may also receive an incoming ARC layer 240 thickness from the pre-strip metrology tool 120. The ARC layer thickness 240 may be used to determine the minimum strip time. Alternatively, a fixed minimum strip time may be used, and the overetch time would be incorporated into the recipe of the strip tool 130 by the process controller 150 only if greater than the minimum strip time.

The process controller 150 may adjust the operating recipe of the strip tool 140 to change the strip time for either or both of the hydrofluoric acid bath and the phosphoric acid bath. Typically, the strip time of the hydrofluoric acid bath is significantly less than the strip time of the phosphoric acid bath, so the process controller 150 may be adapted to only modify the strip time for the phosphoric acid bath.

The process controller 150 may adjust the operating recipe of the strip tool 130 on a lot-by-lot basis based on measurements from a sample of wafers in the lot. Alternatively, the process controller 150 may receive measurements for each wafer and adjust the operating recipe of the strip tool 130 on a wafer-by-wafer basis. The specific frequency selected depends on the amount of variation present in the incoming gate electrode widths and the desired degree of accuracy.

Operating in a feedforward mode, the process controller 150 may implement a predictive modeling technique to predict the strip rate of the strip tool 130. The predicted strip rate may be used in conjunction with the incoming gate electrode 230 width and target gate electrode critical dimension to determine the overetch time. Again, the incoming thickness of the ARC layer 240 may also be incorporated to determine the minimum strip time. Feedback from the post-strip metrology tool 140 may be used to periodically update the model. The feedback measurements may be performed less frequently than the measurements of the incoming wafers 110. Inputs to the predictive model may include the chronological age of the bath used in the strip tool 130 (i.e., to account for time based degradation) and the number of wafers processed in the strip tool 130 (i.e., to account for degradation caused by reaction product buildup).

Figure 4:
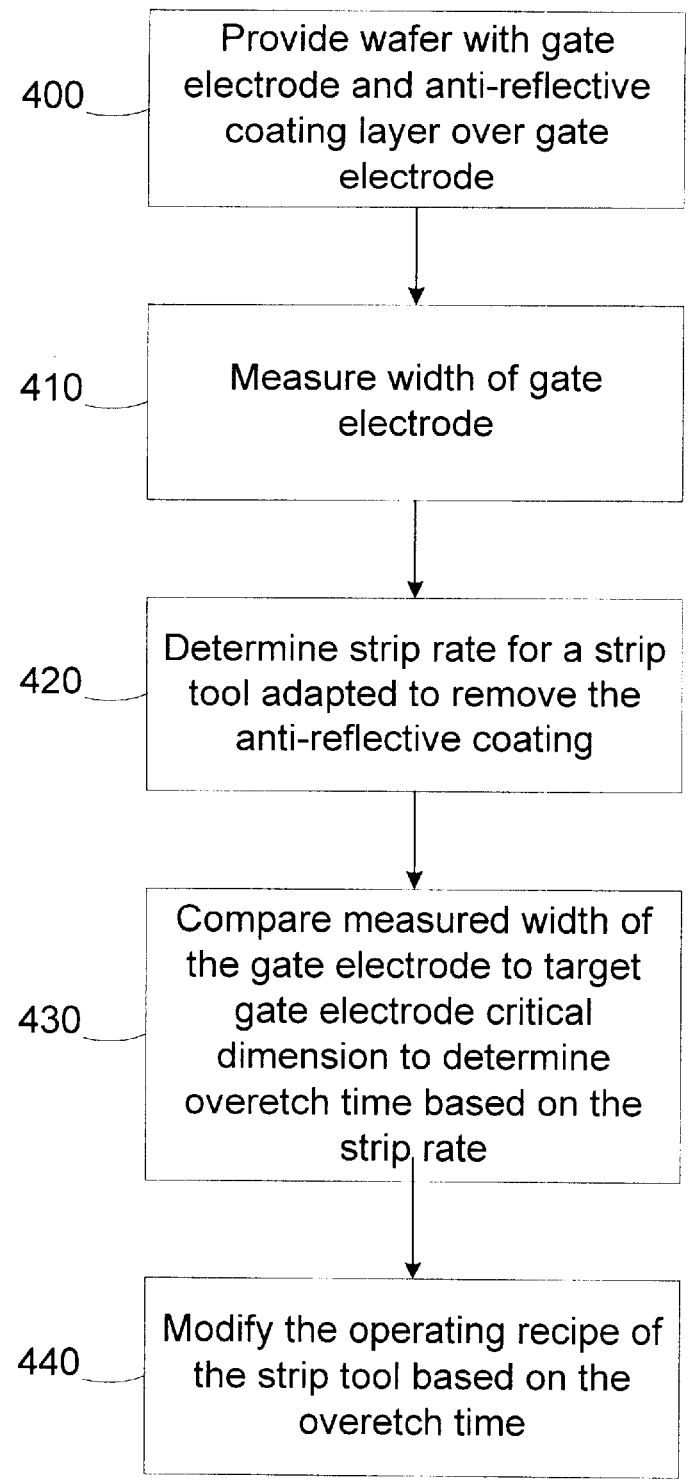
FIG. 4 is a simplified flow diagram of a method for decreasing variations in gate electrode widths in accordance with one illustrative embodiment of the present invention.

Turning now to FIG. 4, a simplified flow diagram of a method for decreasing variations in gate electrode widths in accordance with one illustrative embodiment of the present invention is provided. In block 400, a wafer having a gate electrode formed thereon and an anti-reflective coating layer formed over at least a portion of the gate electrode is provided. In block 410, the width of the gate electrode is measured. A strip rate for a strip tool adapted to remove the anti-reflective coating is determined in block 420. The strip rate may be determined using a predictive performance model, or alternatively, the strip rate may be based on pre-strip and post-strip gate electrode width measurements of previously processed wafers. In block 430, the width of the gate electrode is compared to a target gate electrode critical dimension to determine an overetch time based on the strip rate. In block 440, the operating recipe of the strip tool is modified based on the overetch time.

Controlling the operation of the strip tool 130 as described above reduces the variation in the critical dimensions of the gate electrodes 230 post-strip, while at the same time providing a minimum strip time necessary for removing the ARC layer 240. By using real-time control models to effect the variation reduction, the throughput of the processing line 100 and the quality of the end product may be increased. Increased throughput and reduced variation lead directly to increased profitability.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for decreasing variations in gate electrode widths, comprising:

providing a wafer having a gate electrode formed thereon and an anti-reflective coating layer formed over at least a portion of the gate electrode, the gate electrode having a width;

measuring the width of the gate electrode;

determining a strip rate for a strip tool adapted to remove the anti-reflective coating;

comparing the measured width of the gate electrode to a target gate electrode critical dimension to determine an overetch time based on the strip rate; and modifying the operating recipe of the strip tool based on the overetch time.

2. The method of claim 1, wherein determining the strip rate for the strip tool comprises:

modeling the performance of the strip tool; and predicting the strip rate based on a characteristic of the strip tool and the performance model.

3. The method of claim 2, wherein predicting the strip rate comprises predicting the strip rate based on at least one of a chronological age of a strip bath used in the strip tool and a count of wafers processed in the strip bath.

4. The method of claim 1, wherein determining the strip rate for the strip tool comprises determining the strip rate based on a pre-strip thickness and a post-strip thickness of a previously processed wafer.

5. The method of claim 1, further comprising:
   measuring the thickness of the anti-reflective coating layer; and
   determining a minimum strip time based on the thickness of the anti-reflective coating layer.

6. The method of claim 5, wherein modifying the operating recipe of the strip tool comprises modifying the operating recipe based on the greater of the overetch time and the minimum strip time.

7. The method of claim 6, further comprising setting the overetch time to zero in response to the width of the gate electrode being less than the target gate electrode critical dimension.

8. The method of claim 2, further comprising:
   processing the wafer in the strip tool;
   measuring the width of the gate electrode after processing the wafer; and
   updating the performance model based on the width of the gate electrode measured after processing the wafer.

9. The method of claim 1, wherein determining the strip rate comprises:
   determining a first strip rate for removing the anti-reflective coating layer; and
   determining a second strip rate for reducing the width of the gate electrode.

10. A method for decreasing variations in gate electrode widths, comprising:
    providing a wafer having a gate electrode formed thereon and an anti-reflective coating layer formed over at least a portion of the gate electrode;
    measuring the width of the gate electrode;
    comparing the measured width of the gate electrode to a target gate electrode critical dimension to determine an overetch time;
    determining a minimum strip time for removing the anti-reflective coating layer;
    determining an overetch time for reducing the width of the gate electrode in response to the width of the gate electrode being greater than a target gate electrode critical dimension; and
    processing the wafer in a strip tool for a period of time equal to the greater of the minimum strip time and the overetch time.

11. The method of claim 10, further comprising:
    determining a strip rate for the strip tool; and
    determining at least one of the minimum strip time and the overetch time based on the strip rate.

12. The method of claim 11, wherein determining the strip rate comprises:
    determining a first strip rate for removing the anti-reflective coating layer; and
    determining a second strip rate for reducing the width of the gate electrode.

13. The method of claim 10, wherein determining the strip rate for the strip tool comprises:
    modeling the performance of the strip tool; and
    predicting the strip rate based on a characteristic of the strip tool and the performance model.

14. The method of claim 13, wherein predicting the strip rate comprises predicting the strip rate based on at least one of a chronological age of a strip bath used in the strip tool and a count of wafers processed in the strip bath.

15. The method of claim 11, wherein determining the strip rate for the strip tool comprises determining the strip rate based on a pre-strip thickness and a post-strip thickness of a previously processed wafer.

16. The method of claim 10, further comprising:
    measuring the thickness of the anti-reflective coating layer; and
    determining the minimum strip time based on the thickness of the anti-reflective coating layer.

17. The method of claim 10, further comprising setting the overetch time to zero in response to the width of the gate electrode being less than the target gate electrode critical dimension.

18. The method of claim 13, further comprising:
    processing the wafer in the strip tool;
    measuring the width of the gate electrode after processing the wafer; and
    updating the performance model based on the width of the gate electrode measured after processing the wafer.

* * * * *